(12) United States Patent
Maruta

(10) Patent No.: US 8,718,206 B2
(45) Date of Patent: May 6, 2014

(54) FREQUENCY CORRECTION CIRCUIT, FREQUENCY CORRECTION METHOD AND WIRELESS COMMUNICATION EQUIPMENT USING THEM

(75) Inventor: Yasushi Maruta, Tokyo (JP)

(73) Assignee: NEC Corporation, Tokyo (JP)

( * ) Notice: Subject to any disclaimer, the term of this patent is extended or adjusted under 35 U.S.C. 154(b) by 201 days.

(21) Appl. No.: 13/148,840

(22) PCT Filed: Feb. 16, 2010

(86) PCT No.: PCT/JP2010/052588
§ 371 (c)(1),
(2), (4) Date: Aug. 10, 2011

(87) PCT Pub. No.: WO2010/095732
PCT Pub. Date: Aug. 26, 2010

(65) Prior Publication Data
US 2011/0311004 A1    Dec. 22, 2011

(30) Foreign Application Priority Data
Feb. 18, 2009  (JP) .................................. 2009-034696

(51) Int. Cl.
*H04L 27/06*  (2006.01)

(52) U.S. Cl.
USPC ........... 375/344; 375/316; 375/259; 375/260; 375/346; 375/340

(58) Field of Classification Search
USPC .......... 375/316, 259, 260, 346, 348, 344, 340
See application file for complete search history.

(56) References Cited

U.S. PATENT DOCUMENTS

| | | | | |
|---|---|---|---|---|
| 6,996,156 B1* | 2/2006 | Ono | ............................... | 375/147 |
| 7,139,333 B2* | 11/2006 | Tanada et al. | .................. | 375/316 |
| 7,924,954 B2* | 4/2011 | Maruta | .......................... | 375/344 |
| 2003/0165185 A1* | 9/2003 | Arima et al. | ................... | 375/147 |
| 2011/0007832 A1* | 1/2011 | Yamada et al. | ............... | 375/267 |

FOREIGN PATENT DOCUMENTS

| | | |
|---|---|---|
| JP | 7-176994 A | 7/1995 |
| JP | 2001016135 A | 1/2001 |
| JP | 2001358621 A | 12/2001 |
| JP | 2002118493 A | 4/2002 |
| JP | 2006074265 A | 3/2006 |
| JP | 2008263426 A | 10/2008 |

OTHER PUBLICATIONS

International Search Report for PCT/JP2010/052588 mailed Mar. 30, 2010.

* cited by examiner

*Primary Examiner* — Siu Lee
(74) *Attorney, Agent, or Firm* — Sughrue Mion, PLLC

(57) ABSTRACT

There is obtained a frequency correction circuit capable of correcting the frequency errors of received signals with high accuracy and preventing the degradation of demodulated signals, while further suppressing an increase in the circuit scale. A frequency correction circuit according to the present invention includes a demodulation means that gives respective preset frequency offsets corresponding to a plurality of frequency errors to received radio signals and demodulates said received radio signals by utilizing respective ones of a plurality of preset in-phase summation periods, and a selection means that selects one demodulated signal from among a plurality of demodulated signals demodulated by said demodulation means.

9 Claims, 8 Drawing Sheets

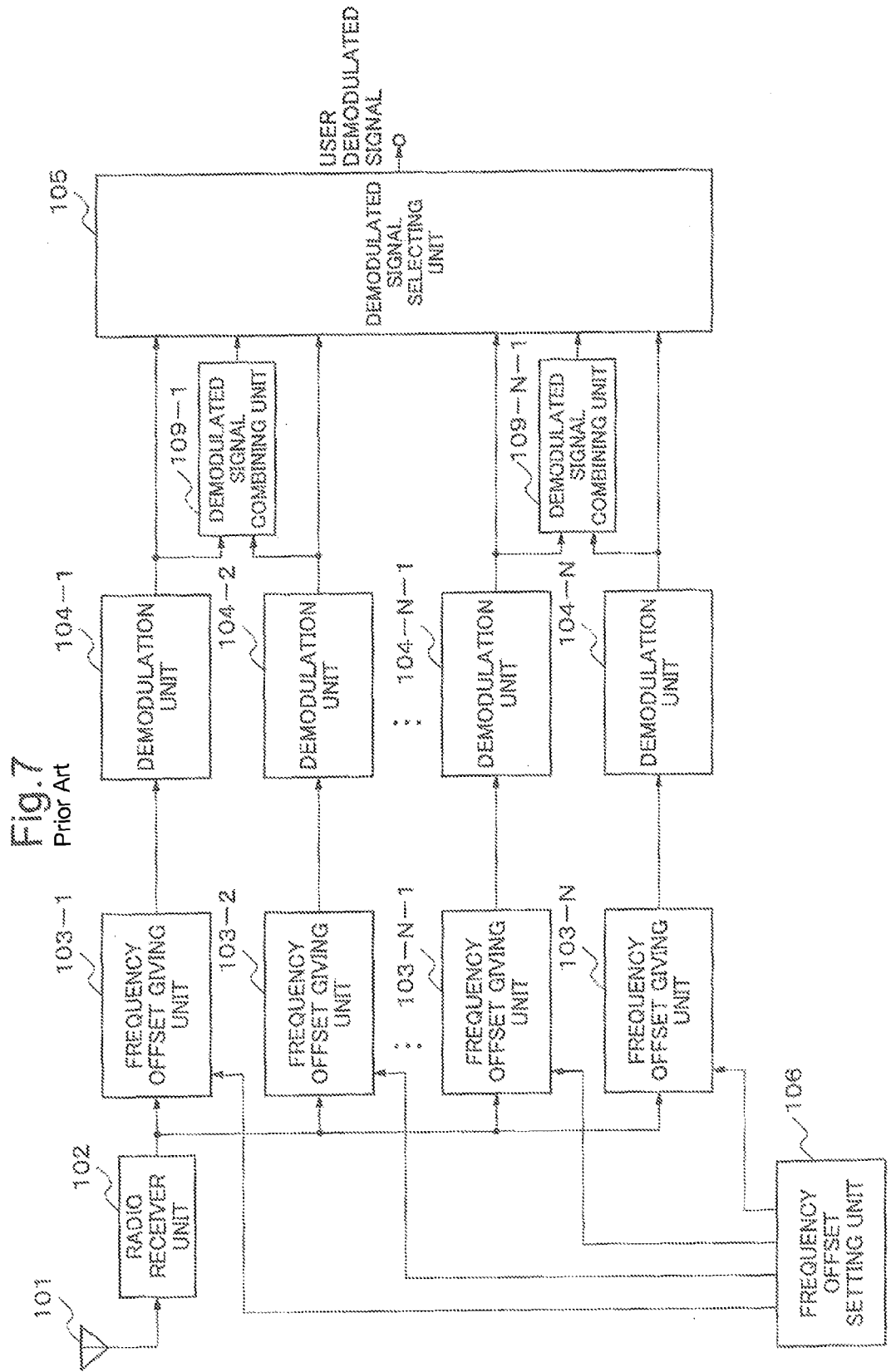

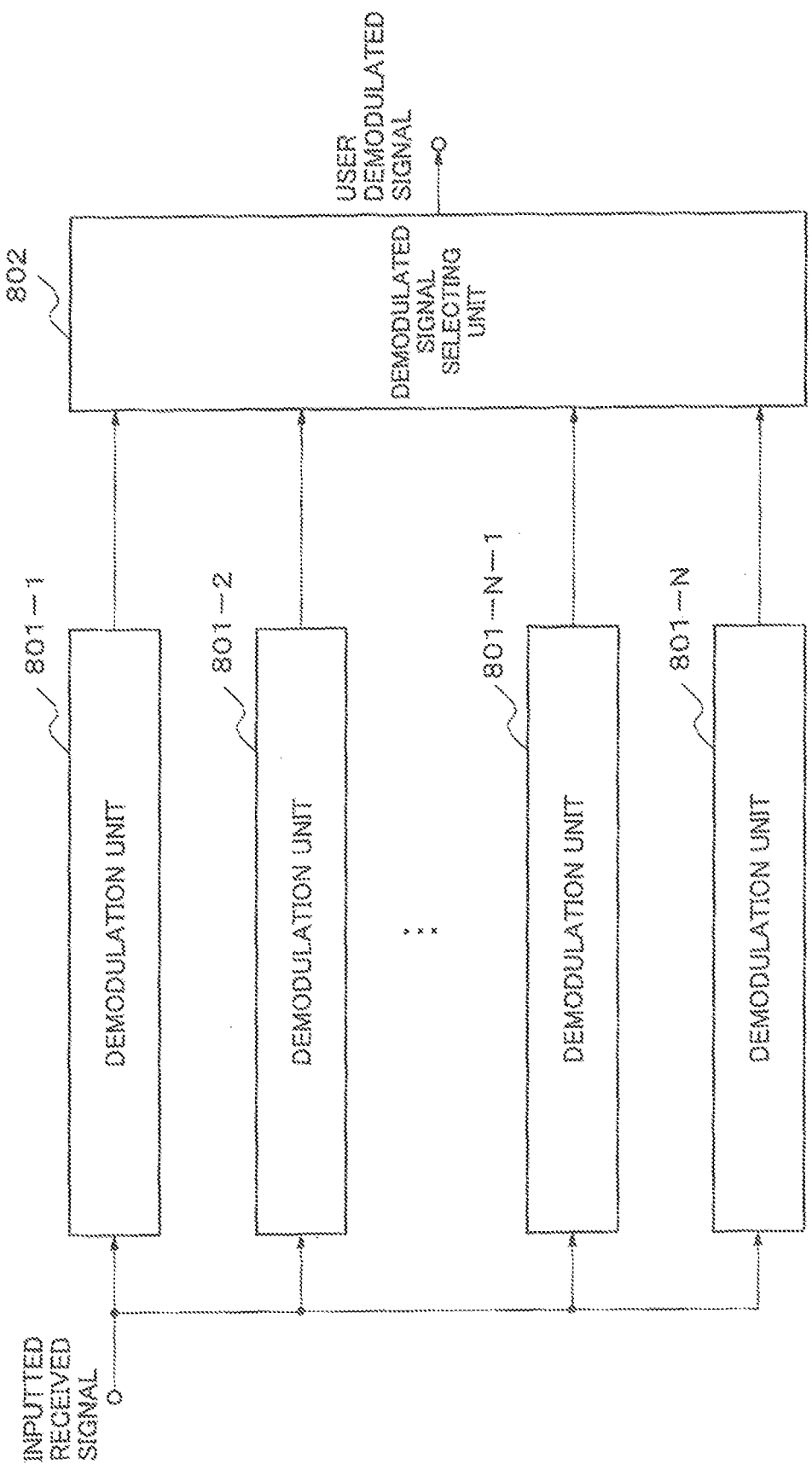

FREQUENCY CORRECTION CIRCUIT, FREQUENCY CORRECTION METHOD AND WIRELESS COMMUNICATION EQUIPMENT USING THEM

TECHNICAL FIELD

The present invention relates to a frequency correction circuit and a frequency correction method, and also to wireless communication equipment using them, and in particular, to a frequency correction system which is used in a receiver unit of wireless communication equipments such as a wireless base station and a mobile terminal.

BACKGROUND ART

In mobile communication systems such as cellular mobile communication systems, communication between a mobile terminal and a wireless base station (hereinafter, referred to simply as a base station) is performed via a wireless transmission channel. As a multiple access system for a base station to communicate with a plurality of mobile, terminals simultaneously, frequency division multiple access (FDMA), time division multiple access (TDMA) and code division multiple access (CDMA) and the like have become into practical use.

In such mobile communication systems, when a frequency error such as a fixed radio frequency discrepancy between a base station and a mobile terminal is present, an operation for correcting the frequency error is generally conducted by the use of automatic frequency control (AFC) in the base station and the mobile terminal. The operation of frequency error correction by AFC is performed by estimating a frequency error of a received signal with the methods such as to control the frequency of a local oscillator and to control a frequency offset which is added to the received signal. The loop control is mainly employed in these methods.

On the other hand, a different method has been proposed with regard to the communication methods such as a burst communication in which the operation of frequency error correction by AFC utilizing the loop control is difficult. In the method, the demodulation is conducted after giving a plurality of fixed frequency offsets, which are prepared in advance, to received signals, and an optimum signal is selected from among the demodulated signals (refer to patent document 1).

FIG. 6 is a functional block diagram showing an example of a frequency correction circuit indicated in the patent document 2 as a related technology. In FIG. 6, a receiver antenna unit 101 receives radio signals from wireless communication equipment of the opposite side, and supplies them to a radio receiver unit 102. This radio receiver unit 102 conducts amplification, frequency conversion from a radio band to a baseband, orthogonal detection and analog to digital (A/D) conversion of the inputted signal, and outputs the signal processed by these kinds of processing to frequency offset giving units 103-1 to 103-N (N is an integer equal to or larger than 1).

Taking the signal outputted from the radio receiver unit 102 and a signal outputted from a frequency offset setting unit 106 as its inputs, each of the frequency offset giving units 103-1 to 103-N gives a frequency offset to the signal from the radio receiver unit 102 and outputs the signal to respective demodulation units 104-1 to 104-N. Specifically, each of the frequency offset giving units conducts a process of phase rotation in accordance with a frequency offset on each symbol of a baseband digital signal, which is outputted from the radio receiver unit 102.

The signals from the frequency offset giving units 103-1 to 103-N are inputted to the demodulation units 104-1 to 104-N. The demodulation unit processes separation of a desired user signal component from a plurality of user signals which are multiplexed, detection and selection of a timing (path delay) of a multi-path component of the desired user signal component, and channel estimation, and then calculates a demodulated signal. These demodulated signals are outputted to a demodulated signal selecting unit 105. The demodulated signal selecting unit 105 selects an optimum demodulated signal from among these demodulated signals.

A frequency offset setting unit 106 determines fixed frequency offsets corresponding to a plurality of frequency errors wholly covering the band in which the frequency errors are assumed to be occurring, and provides them to the frequency offset giving units 103-1 to 103-N As the frequency errors in received signals are corrected by the use of the above-described configuration, it is possible to prevent degradation of the demodulated signals. However, in order to correct a frequency error with high accuracy, it is required to finely cover the band in which the frequency errors is assumed to be occurring, and hence to set a large value for N, which results in an increase in the circuit scale and the cost of equipment.

Accordingly, another frequency correction circuit, which is an improvement over the circuit shown in FIG. 6, is proposed in the patent document 2. FIG. 7 is a functional block diagram showing an example of this improved frequency correction circuit, where the parts equivalents to that in FIG. 6 are indicated with the identical numbers.

In FIG. 7, demodulated signal combining units 109-1 to 109-N−1 are added to the configuration in FIG. 6. Each of the demodulated signal combining units 109-1 to 109-N−1 calculates a combined demodulated signal, by taking the demodulated signals outputted from a plurality of demodulation units among the demodulation units 104-1 to 104-N as its inputs and combining these demodulated signals. The combined demodulated signals thereby calculated are supplied to the demodulated signal selecting unit 105.

The remaining configurations are identical with that in FIG. 6, and their description is omitted here. Further, the example in FIG. 7 presents the case where each of the demodulated signals combining unit 109-1 to 109-N−1 combines two demodulated signals, but there is no limit on the number of demodulated signals combined together. As a method to calculate a combined demodulated signal in the demodulated signal combining units 109-1 to 109-N−1, there is a method, for example, to combine a plurality of demodulated signals whose frequency offsets are adjacent to each other, employing a maximum ratio combining method in accordance with their signal to interference power ratio (SIR) values.

The demodulated signal selecting unit 105 is configured to select an optimum signal from among a group consisting of the demodulated signals outputted from the demodulation units 104-1 to 104-N and the combined demodulated signals outputted from the demodulated signal combining units 109-1 to 109-N−1.

With this configuration, the circuit becomes equivalent to the one in which the number of the fixed frequency offsets corresponding to the frequency errors is effectively twice that of the frequency offset giving units 103-1 to 103-N and of the demodulation units 104-1 to 104-N. Therefore, it becomes possible to configure a frequency correction circuit without making the number N larger.

The patent document 3 can be mentioned as another document describing a related technology, for example.

Patent document 1: Japanese Patent Application Laid-Open No. 1995-176994
Patent document 2: Japanese Patent Application Laid-Open No. 2008-263426
Patent document 3: Japanese Patent Application Laid-Open No. 2001-016135

DISCLOSURE OF INVENTION

The Problem to be Solved

In the above-described frequency correction circuit in FIG. 6, it is required to set an interval of the fixed frequency offsets according to the frequency errors sufficiently small, and thereby to finely cover the band in which the frequency errors are assumed to be occurring. Otherwise, a problem arises in that it is impossible to correct the frequency errors of received signals with high accuracy and hence it is impossible to prevent the degradation at demodulation. If sufficient reduction of the interval of the frequency offsets is aimed at, it is required to provide the same number of the frequency offset giving units and of the demodulation units as that of the fixed frequency offsets corresponding to the frequency errors, which results in an increase in the circuit scale.

According to the frequency correction circuit in FIG. 7, the problem related to FIG. 6 that the demodulated signals are degraded due to a large interval of the fixed frequency offsets according to the frequency errors can be improved without making the number N larger. However, the circuit in FIG. 7 demands addition of the demodulated signal combining units, and therefore cannot meet the request to further suppressing an increase in the circuit scale.

Moreover, because the in-phase summation periods at channel estimation in the demodulation units are fixed, the frequency correction circuits in FIGS. 6 and 7 have a problem that the in-phase summation periods suitable for the frequency errors cannot be employed, and hence the accuracy of channel estimation on the received signals is degraded, and furthermore the demodulated signals are degraded.

An object of the present invention is to provide a frequency correction circuit, a frequency correction method and a wireless communication equipment using them, in which it is possible to correct the frequency errors of received signals with high accuracy and consequently to prevent the degradation of demodulated signals while further suppressing an increase in the circuit scale.

The Means for Solving a Problem

A frequency correction circuit according to the present invention includes
a demodulation means that gives respective preset frequency offsets corresponding to a plurality of frequency errors to received radio signals and modulates said received radio signals by utilizing respective ones of a plurality of preset in-phase summation periods, and a selection means that selects one demodulated signal from among a plurality of demodulated signals demodulated by said demodulation means.

Wireless communication equipment according to the present invention includes the above-described frequency correction circuit.

A frequency correction method according to the present invention includes
a demodulation step that gives respective preset frequency offsets corresponding to a plurality of frequency errors to received radio signals and demodulates said received radio signals by utilizing respective ones of a plurality of preset in-phase summation periods, and a selection step to select one demodulated signal from among a plurality of demodulated signals demodulated in said demodulation step.

Effect Of The Invention

According to the present invention, there is provided an effect of making it possible to correct frequency errors of received signals with high accuracy and prevent the degradation at demodulation while suppressing an increase in the circuit scale.

BRIEF DESCRIPTION OF THE DRAWINGS

FIG. 7 It is a functional block diagram of another example of a frequency correction circuit in relation to the present invention.

FIG. 8 It is a functional block diagram of the fifth embodiment of the present invention.

EXEMPLARY EMBODIMENT

In the following, the embodiments of the present invention will be described with reference to the drawings. Here, in the following embodiments, configurations are described for the case where the present invention is applied in a mobile communication system employing a general multiple access method in which wireless transmission is performed carrying information over the phase. However, the present invention can be applied to any kind of multiple access methods. Moreover, the present invention is applicable to both a base station and a mobile terminal of mobile communication systems and further to wide range of wireless communication equipments.

Figure 1:
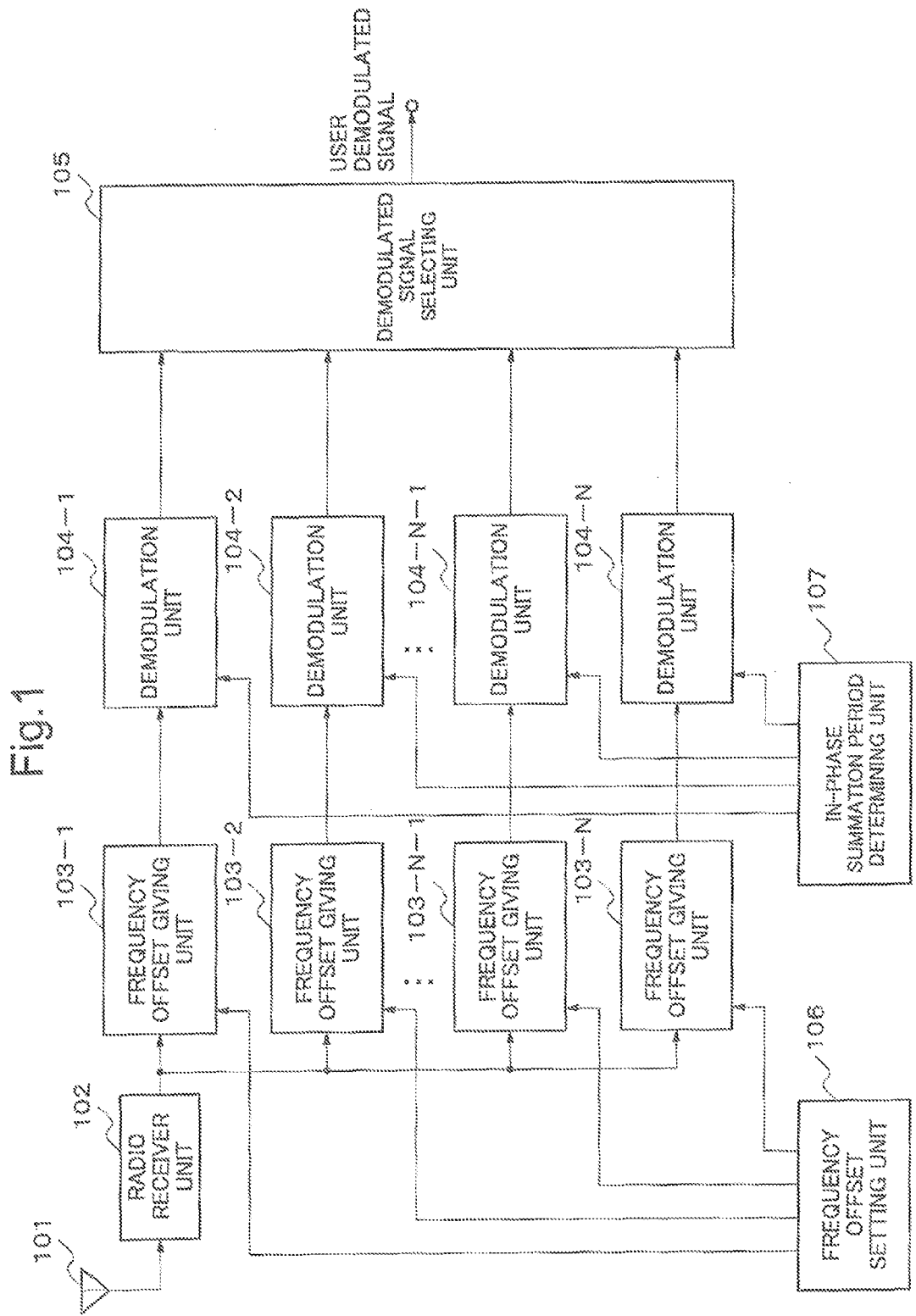
FIG. 1 It is a functional block diagram of the first embodiment of the present invention.
Figure 6:
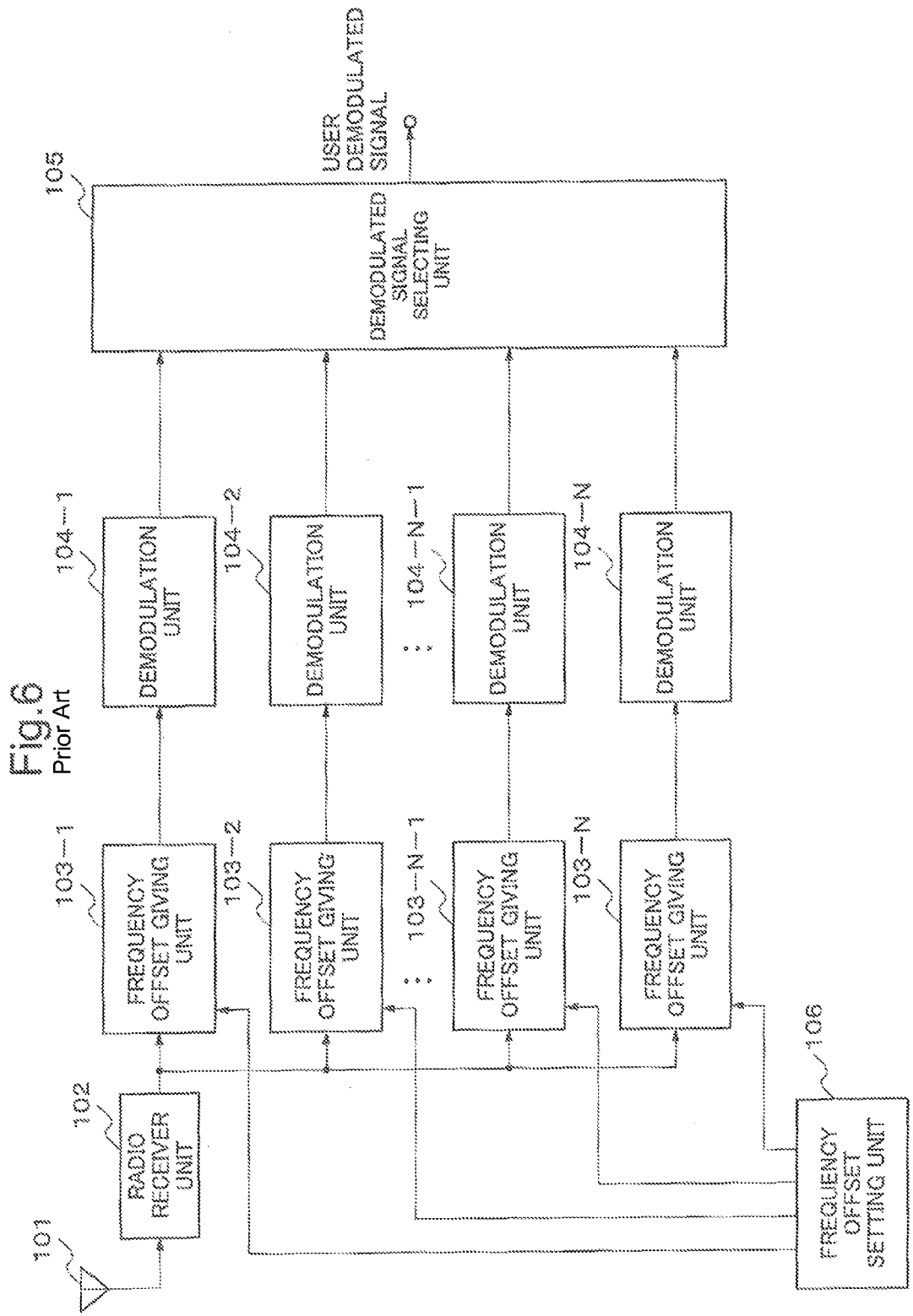
FIG. 6 It is a functional block diagram of an example of a frequency correction circuit in relation to the present invention.

FIG. 1 is a functional block diagram showing the first embodiment of the present invention, where the parts equivalent to those in FIG. 6 are indicated with the identical numbers. In FIG. 1, the difference from the configuration shown in FIG. 6 is the addition of an in-phase summation period determining unit 107. That is, the difference is that the information of in-phase summation periods determined by this in-phase summation period determining unit 107 is supplied to respective demodulation units 104-1 to 104-N. The remaining parts of the configuration are identical with those in FIG. 6.

The frequency correction function according to this embodiment is configured by comprising a receiver antenna unit 101, a radio receiver unit 102, frequency offset giving units 103-1 to 103-N, demodulation units 104-1 to 104-N and a demodulated signal selecting unit 105. Further, the frequency correction function according to this embodiment is configured by comprising a frequency offset setting unit 106 and an in-phase summation period determining unit 107.

There is no limit on the number and the arrangement manner of receiver antenna elements in the receiver antenna unit

101. The radio receiver unit 102 generally comprises a low noise amplifier, a band-limiting filter, a mixer, a local oscillator, a automatic gain controller (AGC), a orthogonal detector, a low pass filter, a A/D converter and so on. In the present invention, there is no limit on a configuration of the radio receiver unit.

Figure 2:
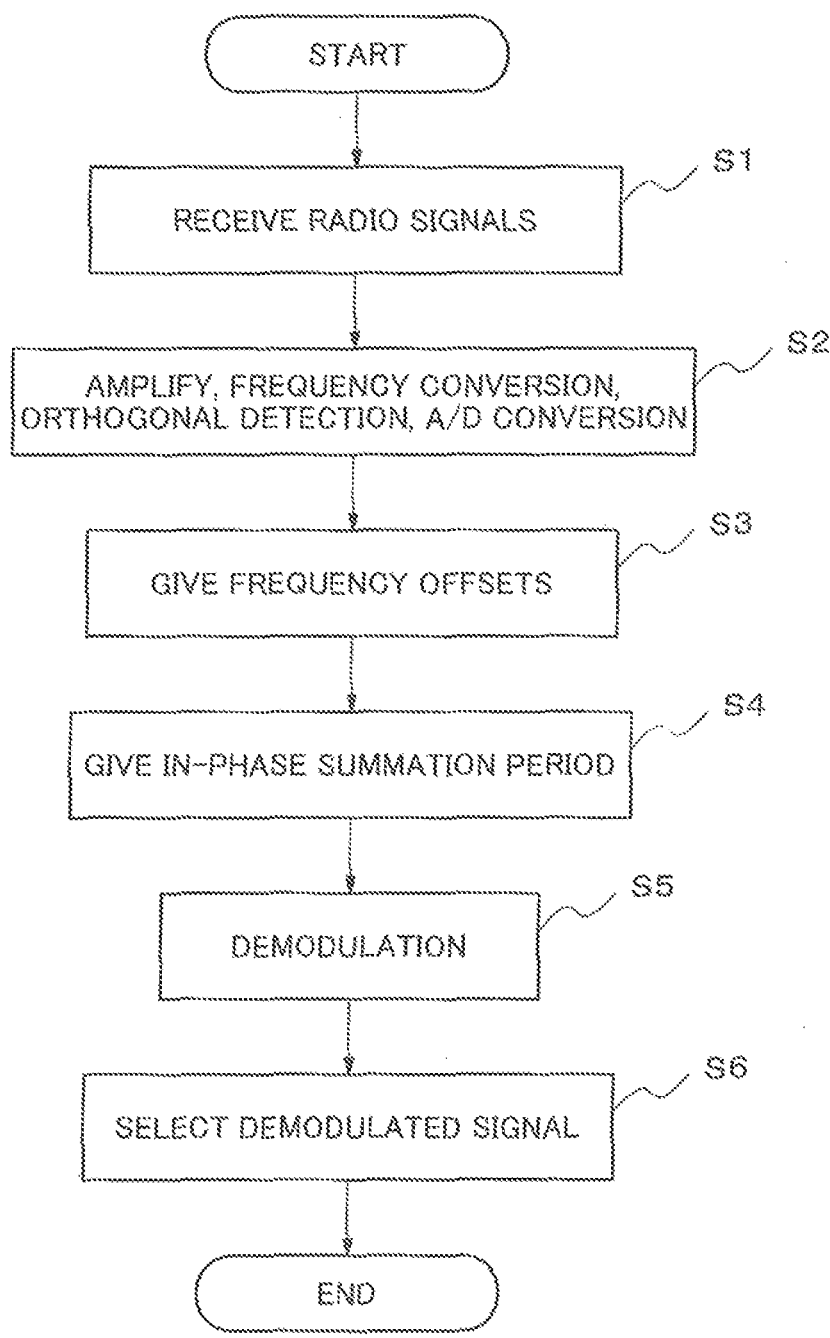
FIG. 2 It is a flow chart showing the operation of the first embodiment of the present invention.

In the following, the operation of the first embodiment of the present invention shown in FIG. 1 is described in detail with reference also to a flow chart shown in FIG. 2.

The signal received by the receiver antenna unit 101 contains user signal components, which were transmitted from each mobile terminal and via a plurality of wireless transmission channels, interference signal components and thermal noise. In addition, there are contained multi-path components with different delays for each of the user signal components, due to that the signal passes a plurality of wireless transmission channels.

Taking the output of the receiver antenna unit 101 as an input (step S1), the radio receiver unit 102 conducts amplification, frequency conversion from a radio band to a baseband (normal band), orthogonal detection and A/D conversion on the input signal, and provides an output to the frequency offset giving units 103-1 to 103-N (step S2). The output of the radio receiver unit 102 and respective outputs of the frequency offset setting unit 106 are inputted to the frequency offset giving units 103-1 to 103-N. That is, the frequency offsets, which are the outputs of the frequency offset setting unit 106, are given to the received signal, which is an output of the radio receiver unit 102 (step S3), and the resultant signals are outputted to respective demodulation units 104-1 to 104-N.

Specifically, on each symbol in a baseband digital received signal, which is an output of the radio receiver unit 102, a process of phase rotation is conducted in accordance with the quantity of a frequency offset, which is an output of the frequency offset setting unit 106. Here, the quantity of a frequency offset, which is an output of the frequency offset setting unit 106, may be set at a predetermined fixed value. Although the frequency offset giving unit 103 is arranged next to the radio receiver unit 102 in FIG. 1, a frequency correction method of the present invention can be realized also by the use of a method to control the local oscillator frequency in the radio receiver unit 102, and such configurations and methods are also included in the present invention.

Respective outputs of the frequency offset giving units 103-1 to 103-N and an output of the in-phase summation period determining unit 107 are inputted to each of the demodulation units 104-1 to 104-N (step S4). The demodulation units conduct the separation of a desired user signal component from a plurality of multiplexed user signal components and the detection/selection of the timings (path delays) of multipath components of a desired user signal component, and also conduct the estimation of wireless transmission line channel at the selected timing. Then, each of these demodulation units eliminates a wireless transmission line fluctuation component from the received signal, using the result of the channel estimation, and calculates a demodulated signal (step S5). Each of these demodulated signals is outputted to the demodulated signal selecting unit 105.

Here, there is no limit on the method to separate a desired user signal component from among a plurality of multiplexed user signal components, on the method for the detection/selection of a path delay and on the number of the detected/selected path delays. As an example of a method for detecting a path delay, there is mentioned a method to detect a path delay using the known symbols (such as pilot symbols) included at every section (slot) of a certain interval in a desired user signal. It is also possible to apply a method such as to detect a path delay using the known symbols included at every section of a certain interval in a signal common to all users.

There is mentioned a method to select a path delay satisfying a criterion, following a predetermined criterion for the selection, as an example of a method for selecting a path delay. Examples of the criterion for the selection are shown below.

(1) select the path delays corresponding to the desired user signals of the M most largest magnitudes, where M is an integer equal to or larger than 1.

(2) select the path delays corresponding to desired user signals of the M most largest signal to interference power ratio (SIR).

(3) select the path delays corresponding to the desired user signal components whose magnitudes are larger than a threshold value.

(4) select the path delays corresponding to the desired user signals whose SIR values are larger than a threshold value.

Further, the wireless transmission line channel estimation is to estimate a variation in the phase of a received signal caused by a wireless transmission line. As an example of a method for the wireless transmission line channel estimation, there is mentioned a method to estimate using the known symbols (such as a pilot symbols) included at every section (such as a slot) of a certain interval in a desired user signal. There are other methods such as that to estimate using the known symbols included at every section of a certain interval in a signal common to all users.

Here, the processing of a vector (complex) addition of a plurality of successive channel estimation results, which is conducted to improve the accuracy of a wireless transmission line channel estimation, is referred to as an in-phase summation (refer to the patent document 3). The in-phase summation is conducted symbol by symbol in one case and slot by slot in another case, but there is no particular limit on it. Further, there is no particular limit also on its period, that is, an in-phase summation period. However, it is known that, if a large value is assigned as an in-phase summation period, the accuracy of channel estimation is improved for a received signal with a small frequency error, but is significantly degraded, that is, the frequency band of the channel estimation narrows, for a received signal with a large frequency error.

This is because the effect of an in-phase summation becomes difficult to obtain due to a phase rotation of the channel estimation result caused by a frequency error. In the worst case where the phase difference between two channel estimation results approaches 180 degrees, the vector components cancel each other out. On the other hand, if a small value is assigned as an in-phase summation period, the effect of an in-phase summation on the accuracy of channel estimation diminishes, but the channel estimation on a received signal with a large frequency error becomes possible, that is, the frequency band of the channel estimation widens.

Accordingly, in the in-phase summation period determining unit 107, on the basis of the above description, it is possible to aim at an improvement in the channel estimation accuracy, for example, by assigning a large in-phase summation period to the frequency offset for which the possibility of frequency error generation is statistically high. With regard to other frequency offsets, it is possible to widen the frequency band of the channel estimation by assigning a small in-phase summation period to them.

In this case, with regard to the frequency offsets to which large in-phase summation periods are assigned, the interval between adjacent frequencies after having given the frequency offsets is set narrow. On the contrary, with regard to the frequency offsets to which small in-phase summation periods are assigned, the interval between adjacent frequencies after having given the frequency offsets is set wide.

By doing this, it is possible to wholly cover the band in which the frequency errors are likely to be occurring, and furthermore to save the number (N) of the frequency offset giving units and that of the demodulation units, while realizing high channel estimation accuracy on the signals in the frequency band with a possible frequency error.

Further, for example, in the case such as when a mobile terminal is moving fast toward or away from a base station in an unobstructed environment, as the variations per unit time of apparent frequency errors (Doppler frequencies) of received signals become large, it is appropriate for the in-phase summation period determining unit 107 to perform a control to reduce the values of in-phase summation period. By this, while saving the number (N) of the frequency offset giving units and that of the demodulation units, it becomes possible to conduct the channel estimation with high accuracy on received signals with a large Doppler frequency variation. It is even acceptable to have only one set of the frequency offset giving unit and the demodulation unit.

The demodulated signal selecting unit 105 takes the demodulated signals, which are the outputs of respective demodulation units 104-1 to 104-N, as its inputs, and selects an optimum demodulated signal from among these demodulated signals (step S6). Here, there is no limit on the selection method. There is mentioned a method to select the demodulated signal having the largest signal to interference power ratio value, as an example of a selection method.

Further, with regard to the selection of an optimum demodulated signal described above, there is included in the present invention a method to increase the signal selection accuracy by conducting a correction taking an in-phase summation period into consideration, when comparing the demodulated signals having different in-phase summation periods. Here, although there is no limit on the correction method, a method to multiply the reciprocals of in-phase summation periods is mentioned as an example.

The frequency offset setting unit 106 determines the setting values for the frequency offsets, taking into account the in-phase summation periods (the frequency band of the channel estimation) determined in the in-phase summation period determining unit 107.

For example, as described above, with regard to the frequency offsets to which large in-phase summation periods are assigned, the interval between adjacent frequencies after having given the frequency offsets is set small. On the contrary, with regard to the frequency offsets to which small in-phase summation periods are assigned, the interval between adjacent frequencies after having given the frequency offsets is set wide.

In this manner, the fixed frequency offsets corresponding to a plurality of frequency errors, which wholly cover the band in which the frequency errors are assumed to be occurring, are determined and outputted to respective frequency offset giving units 103-1 to 103-N. Here, although an example with the number of N is shown in FIG. 1, there is no limit on the number of the fixed frequency offsets corresponding to the frequency errors.

The in-phase summation period determining unit 107 determines the in-phase summation periods corresponding to the frequency band of the channel estimation, and outputs them to respective demodulation units 104-1 to 104-N. There is no limit on a method to determine an in-phase summation period. For example, there is a method to determine an in-phase summation period to be inversely proportional to the variation per unit time of a frequency error. The number of the in-phase summation periods to determine is equal to that of the frequency offsets N.

Further, it is also possible that a common frequency offset is set to a plurality of demodulation units by a frequency offset setting unit 106 and in-phase summation periods different from each other are set to respective ones of these demodulation units by the in-phase summation period determining unit 107. By this, it is also possible to increase further the accuracy of channel estimation in the case where the variations per unit time of the apparent frequency errors are particularly large.

Resulting from the above configurations and operations the following effects are achieved with regard to the example shown in FIG. 1, compared to the cases with a constant in-phase summation period. That is, it becomes possible to save the number of the frequency offset giving units and that of the demodulation units while wholly covering the band in which the frequency errors are assumed to be occurring, while realizing a high accuracy of channel estimation on the signals in the frequency band with a possible frequency error. Further, even when the variations per unit time of the apparent frequency errors are large, it becomes possible to perform the channel estimation with high accuracy while saving the number of the frequency offset giving units and that of the demodulation units.

Therefore, according to the present embodiment, with regard to the communication methods in which the operation of frequency error correction by AFC utilizing loop control is difficult, it is possible to correct a frequency error of a received signal with high accuracy and prevent the degradation at demodulation, while suppressing an increase in the circuit scale. Further, compared to the AFC utilizing loop control, even in the case where the operation of frequency error correction by the AFC with loop control does not converge, it is possible to correct a frequency error of a received signal with high accuracy and prevent the degradation at demodulation, while suppressing an increase in the circuit scale. Moreover, even when the variation per unit time of the apparent frequency error is large, it is possible to prevent the degradation at demodulation while suppressing an increase in the circuit scale.

Figure 3:
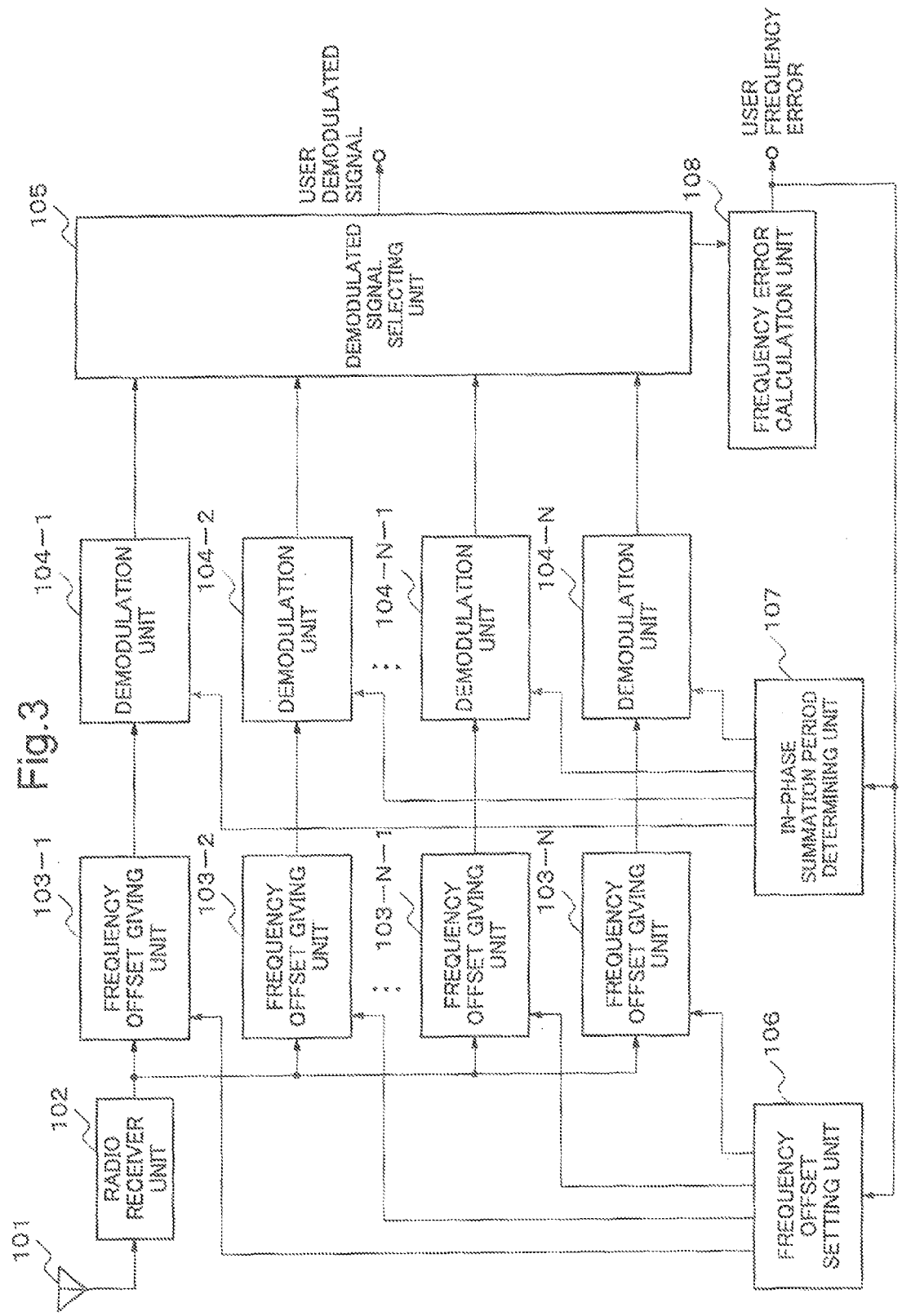
FIG. 3 It is a functional block diagram of the second embodiment of the present invention.

FIG. 3 is a functional block diagram showing the second embodiment of the present invention, where the parts equivalent to those in FIG. 1 are indicated by the identical numbers. Compared to the first embodiment shown in FIG. 1, a frequency error calculation unit 108 is added, and a user frequency error, which is an output of this frequency error calculation unit 108, is inputted to the frequency offset setting unit 106 and the in-phase summation period determining unit 107. The remaining configurations are equivalent to that in FIG. 1.

The frequency error calculation unit 108 takes the frequency offset information corresponding to an optimum demodulated signal, which is an output of the demodulated signal selecting unit 105, as its input, and calculates the user frequency error corresponding to the optimum demodulated signal, and outputs it to each of the frequency offset setting unit 106 and the in-phase, summation period determining unit 107.

Here, there is no limit on a method to calculate the user frequency error corresponding to the optimum demodulated signal. As an example of a method to calculate a frequency error corresponding to the optimum demodulated signal, there is mentioned a method to employ the difference or the ratio between the signal to interference power ratio of the optimum demodulated signal and that of the demodulated signal corresponding to adjacent frequency offset.

For example, with regard to adjacent two frequency offsets, if a comparison of the signal to interference power ratios of the demodulated signals having an identical path delay or the delays adjacent to each other resulted in almost 1:1, it is highly probable that the user frequency error was present around the middle of the two compared frequency offsets. Further, if there were no demodulated signals having an identical path delay or the delays adjacent to each other, with regard to the adjacent frequency offsets, it is highly probable that the frequency offset selected as an optimum demodulated signal was the desired user frequency error.

As a specific example, it is assumed, with regard to the adjacent two frequency offsets A and B (here, A<B is assumed), that the signal to interference power ratios of the demodulated signals having an identical path delay are SIR_A and SIR_B, respectively. In this case, when A is selected as the frequency offset of the demodulated signal selected as an optimum demodulated signal having the maximum signal to interference power ratio, and further SIR_B/SIR_A is 0.67 or less, it is judged that the desired frequency error was A. Further, when SIR_B/SIR_A is larger than 0.67 but not larger than 1, it is judged that the value calculated as (A+B)/2 is the desired frequency error. Here, because A is the frequency offset of the demodulated signal having the maximum signal to interference power ratio, SIR_B/SIR_A may not be larger than 1.

The user frequency error, which is an output of the frequency error calculation unit 108, is inputted to the frequency offset setting unit 106. In the frequency offset setting unit 106, fixed frequency offsets, which are limited to the value around the inputted user frequency error, is determined taking into account the in-phase summation periods determined in the in-phase summation period determining unit 107, that is, the frequency band of the channel estimation. The determined frequency offsets are outputted to respective frequency offset giving units 103-1 to 103-N.

Taking the user frequency error, which is an output of the frequency error calculation unit 108, as its input, the in-phase summation period determining unit 107 determines in-phase summation periods corresponding to the frequency band of the channel estimation, and outputs them to respective demodulation units 104-1 to 104-N.

By calculating the user frequency error corresponding to an optimum demodulated signal, and reflecting the user frequency error as frequency offsets and in-phase summation periods, convergence of the operation of frequency error correction can be realized in a short time. Further, compared to AFC utilizing loop control, even in the case where the operation of frequency error correction by AFC utilizing loop control does not converge, it is possible to estimate a frequency error of a received signal with high accuracy, while suppressing an increase in the circuit scale.

Next, the third embodiment of the present invention will be described with reference to FIG. 4. This embodiment is obtained by improving the frequency correction circuit shown in FIG. 7. Identical numbers are assigned to the parts in FIG. 7 equivalent to that in FIG. 1.

In the example in FIG. 7 compared with that in FIG. 1, a plurality of demodulated signal combining units 109-1 to 109-N−1 which take the demodulated signals, which are respective outputs of the demodulation units, as their inputs are newly added. The combined demodulated signals which are respective outputs of these demodulated signal combining units are inputted to the demodulation signal selecting unit 105 as the demodulated signals from respective demodulation units are.

Each of the demodulated signal combining unit 109-1 to 109-N−1 takes a plurality of arbitrary ones among respective outputs of the demodulation units 104-1 to 104-N as its inputs, and calculates a combined demodulated signal from a plurality of demodulated signals (the example in the figure is indicated assigning respective outputs of two adjacent demodulation units as the inputs).

These respective combined demodulated signals derived by the demodulated signal combining unit 109-1 to 109-N−1 are outputted to the demodulated signal selecting unit 105. In FIG. 4 an example is shown to combine two demodulated signals, but there is no limit on the number of demodulated signals to be combined. Further, there is no limit also on a method to calculate a combined demodulated signal. As an example of a method to calculate a combined demodulated signal, there is mentioned a method to combine a plurality of demodulated signals whose frequency offsets are adjacent to each other, employing a maximum ratio combining method in accordance with the signal to interference power ratio values.

The method to calculate a combined demodulated signal may be such as the one to employ the path delay information detected/selected in the demodulation unit and combine only the demodulated signals whose path delays are identical with each other. Also, the method to calculate a combined demodulated signal may be such as the one to employ the path delay information detected/selected in the demodulation unit and combine only the demodulated signals whose path delays are adjacent to each other. Moreover, it is also possible to conduct a correction employing correlation coefficients in accordance with the interval of frequency offsets, in the calculation of a combined demodulated signal.

The demodulated signal selecting unit 105 takes, as its inputs, the demodulated signals which are respective outputs of the demodulation units 104-1 to 104-N and the combined demodulated signals which are respective outputs of the demodulated signal combining units 109-1 to 109-N−1, and selects an optimum demodulated signal from among these demodulated signals and combined demodulated signals. Here, there is no limit on a method for the selection. As an example of a selection method, there is mentioned the one to select a modulated signal or a combined demodulated signal of the maximum signal to interference power ratio.

Figure 4:
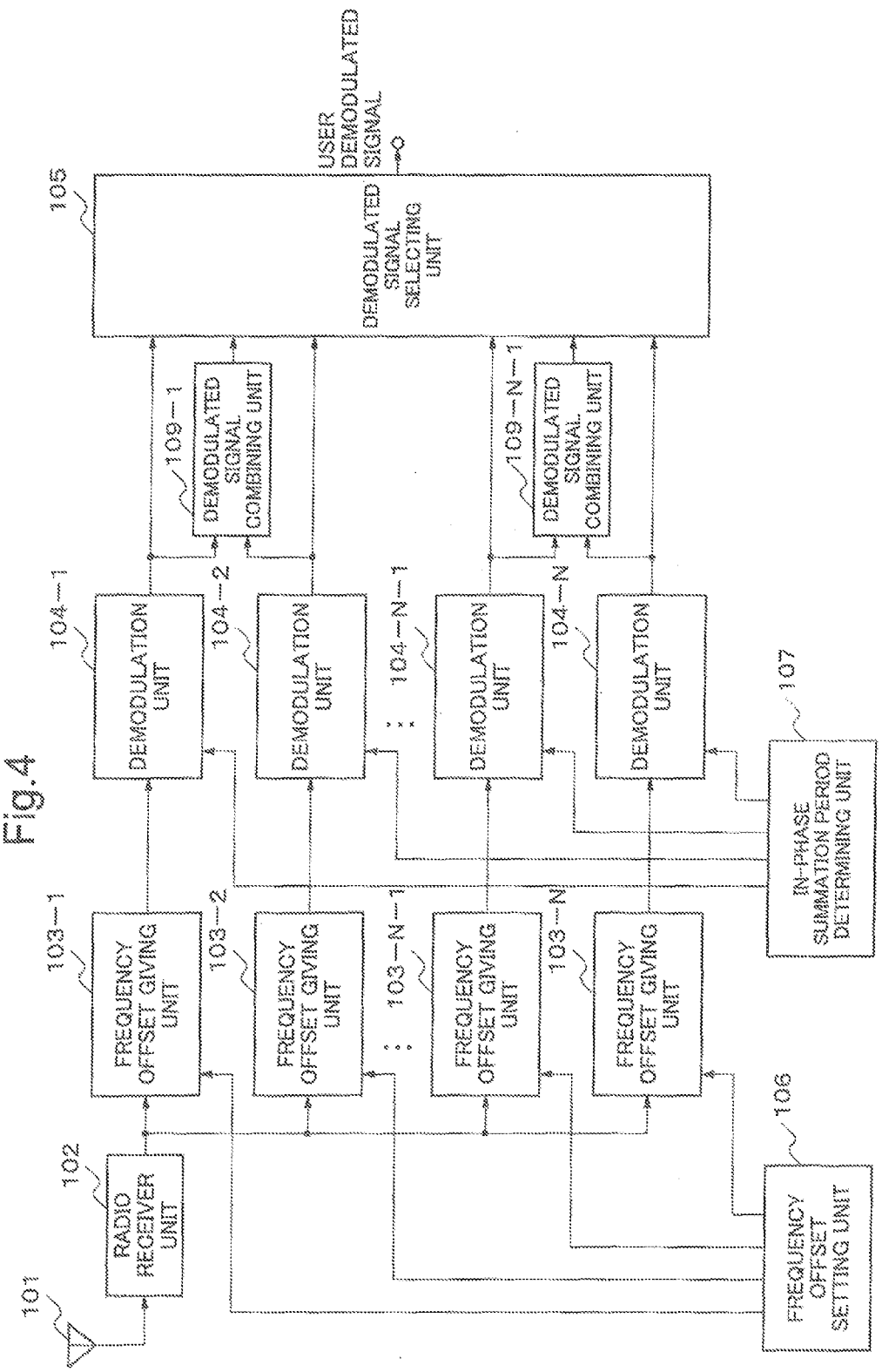
FIG. 4 It is a functional block diagram of the third embodiment of the present invention.

Resulting from the above configuration and operation, the example in FIG. 4 is effectively provided with the fixed frequency offsets corresponding to the frequency errors whose number is almost twice that of both the fixed frequency offset giving units and the demodulation units N. Therefore, according to the present invention, it is possible to increase the number of the fixed frequency offsets corresponding to the frequency errors, without increasing that of both the fixed frequency offset giving units and a demodulation units N. Further, even compared with the configuration in FIG. 7, as the number of the fixed frequency offsets corresponding to the frequency errors can be increased without increasing N, when the effective number of the frequency offsets is assumed to be identical, it is possible to cut the number N almost in half and consequently to aim at further reduction of the circuit scale.

Further, the demodulated signal combining units can be realized with a circuit configuration comprising mainly the circuits for the addition of digital signals, and its circuit scale is smaller compared to that of the fixed frequency offset giving unit and of the demodulation unit. Therefore, according to the present embodiment, with regard to the communication methods in which the operation of frequency error correction by AFC utilizing loop control is difficult, it is possible to correct a frequency error of a received signal with high accuracy and prevent the degradation at demodulation, while further suppressing an increase in the circuit scale. Further, compared to AFC utilizing loop control, even in the case where the operation of frequency error correction by AFC with loop control does not converge, it is possible to correct a frequency error of a received signal with high accuracy and prevent the degradation at demodulation, while further suppressing an increase in the circuit scale. Moreover, even when the variation per unit time of apparent frequency error is large, it is possible to prevent the degradation at demodulation while further suppressing an increase in the circuit scale.

Figure 5:
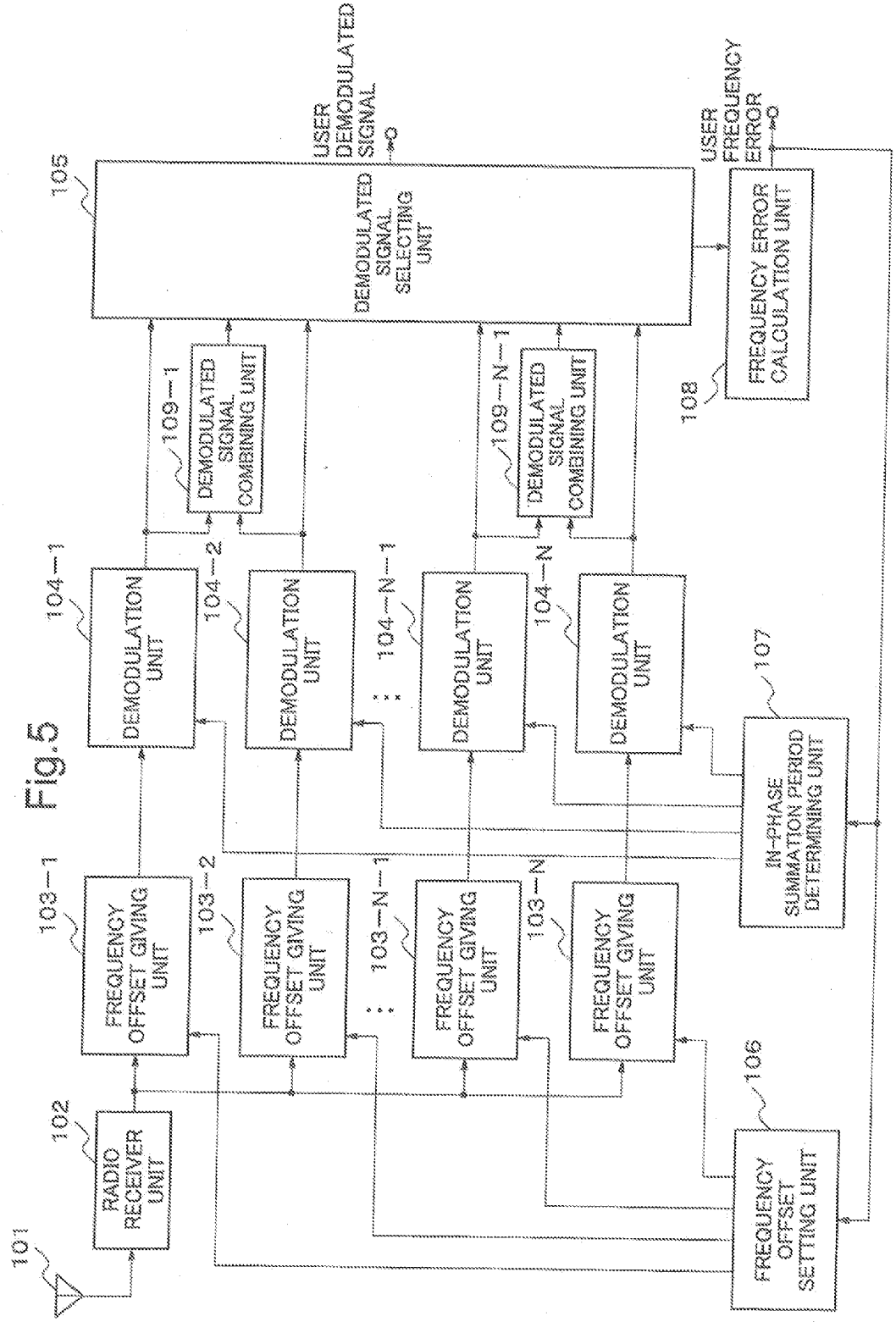
FIG. 5 It is a functional block diagram of the fourth embodiment of the present invention.

Next, the fourth embodiment of the present invention will be described with reference to FIG. 5. This example is obtained by adding the frequency error calculation unit 108 shown in FIG. 3 to the example in FIG. 4. In FIG. 5, the parts equivalents to that in FIG. 1 and FIGS. 3 to 5 are indicated with the identical numbers.

Thus combining the second embodiment shown in FIG. 3 and the third embodiment shown in FIG. 4, convergence of the operation of a frequency error correction can be realized in a short time, while further suppressing an increase in the circuit scale. Further, compared to AFC utilizing loop control, even in the case where the operation of frequency error correction by AFC with loop control does not converge, it is possible to estimate a frequency error of a received signal with high accuracy, while further suppressing an increase in the circuit scale.

Next, the fifth embodiment of the present invention will be described with reference to FIG. 8.

FIG. 8 is a block diagram showing the fifth embodiment of the present invention.

A frequency correction function according to this embodiment is configured by comprising a plurality of demodulation units 801-1 to 801-N and a demodulated signal selecting unit 802.

In the following, the operation of the fifth embodiment of the present invention shown in FIG. 8 is described in detail.

Received signals are inputted to a plurality of demodulation units 801-1 to 801-N.

In a plurality of demodulation units 801-1 to 801-N, the demodulation is conducted giving respective preset frequency offsets corresponding to a plurality of frequency errors to the received radio signals and using respective ones of a plurality of preset in-phase summation periods. In the demodulated signal selecting unit 802, one demodulated signal is selected from among a plurality of demodulated signals demodulated by the above-described demodulation means, and then outputted as a user demodulated signal.

Resulting from the above configuration and operation, the following effects are achieved with regard to the example in FIG. 8, compared to the case with a constant in-phase summation period. That is, by using different in-phase summation periods, the frequency offsets can be set unequally-spaced. As a result, it becomes possible to reduce the number of the demodulation units while wholly covering the band in which the frequency errors are assumed to be occurring, while realizing high channel estimation accuracy on a signal in the frequency band with a possible frequency error. Further, even when the variation per unit time of the apparent frequency error is large, it becomes possible to perform the channel estimation with high accuracy in the demodulation unit, as a result of conducting the modulation employing a suitable in-phase summation period.

As above, the present invention has been described with reference to the embodiments, but the present invention is not limited to the above-described embodiments. Various changes which a person skilled in the art can understand in the scope of the present invention can be performed in the composition of the present invention and details.

This application is based upon and claims the benefit of priority from Japanese patent application No. 2009-034696, filed on Feb. 18, 2009, the disclosure of which is incorporated herein in its entirety by reference.

Industrial Applicability

The present invention relates to a frequency correction method used in a receiver unit of wireless communication equipments and has industrial applicability.

Description Of Numbers

101 receiver antenna unit
102 radio receiver unit
103-1 to 103-N frequency offset driving unit
104-1 to 104-N demodulation unit
105 demodulated signal selecting unit
106 frequency offset setting unit
107 in-phase summation period determining unit
108 frequency error calculation unit
109-1 to 109-N−1 demodulation signal combining unit

The invention claimed is:

1. A frequency correction circuit, including
a frequency offset giving unit comprising circuitry that is configured to give preset frequency offsets corresponding to a plurality of frequency errors to respective received radio signals;
a demodulation unit comprising circuitry that is configured to demodulate said frequency offset received radio signals by utilizing respective ones of a plurality of preset in-phase addition lengths, and
a selection unit comprising circuitry that is configured to select one demodulated signal from among a plurality of demodulated signals demodulated by said demodulation unit.

2. The frequency correction circuit according to claim 1, further including
a combining unit comprising circuitry that is configured to combine arbitrary number of demodulated signals from among said plurality of demodulated signals into a combined demodulated signal, wherein
said circuitry of said selection unit is further configured to select one demodulated signal from among a group including said plurality of demodulated signals and said combined demodulated signals.

3. The frequency correction circuit according to claim 1, further including:
a frequency error calculation unit comprising circuitry that is configured to calculate said frequency errors on the basis of frequency offsets of the signals selected by said selection unit,
wherein said frequency offsets and in-phase addition lengths to be given to said received signals are determined respectively on the basis of these calculated frequency errors.

4. The frequency correction circuit according to claim 3, wherein
said circuitry of said frequency error calculation unit is further configured to calculate said frequency errors by utilizing a difference or a ratio between the signal to interference power ratios of the demodulated signals corresponding to the frequency offsets adjacent to each other.

5. The frequency correction circuit according to claim 1, wherein
said circuitry of said selection unit is further configured to select a demodulated signal or a combined demodulated signal with the maximum signal to interference power ratio.

6. A wireless communication equipment, including the frequency correction circuit according to claim 1.

7. A frequency correction method, including
giving preset frequency offsets corresponding to a plurality of frequency errors to respective received radio signals and demodulating said frequency offset received radio signals by utilizing respective ones of a plurality of preset in-phase addition lengths, and
selecting one demodulated signal from among a plurality of demodulated signals demodulated in said demodulating.

8. The frequency correction method according to claim 7, further including
combining arbitrary number of demodulated signals from among said plurality of demodulated signals together to generate a combined demodulated signal, wherein
said selecting selects one demodulated signal from among a group including said plurality of demodulated signals and said combined demodulated signals.

9. The frequency correction method according to claim 7, wherein
said frequency errors are calculated on the basis of frequency offsets of the signals selected in said selecting, and
frequency offsets and in-phase addition lengths to be given to said received signals are determined respectively on the basis of these calculated frequency errors.

* * * * *